US012812764B2

(12) United States Patent
Shigeta

(10) Patent No.: US 12,812,764 B2
(45) Date of Patent: Nov. 24, 2026

(54) ELECTRONIC APPARATUS CAPABLE OF EFFICIENTLY COOLING HEAT SOURCE

(71) Applicant: CANON KABUSHIKI KAISHA, Tokyo (JP)

(72) Inventor: Koichi Shigeta, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 246 days.

(21) Appl. No.: 18/774,013

(22) Filed: Jul. 16, 2024

(65) Prior Publication Data

US 2025/0040025 A1 Jan. 30, 2025

(30) Foreign Application Priority Data

Jul. 24, 2023 (JP) ................................ 2023-119923

(51) Int. Cl.
*H05K 7/20* (2006.01)
*H04N 23/52* (2023.01)
*H05K 1/02* (2006.01)

(52) U.S. Cl.
CPC ........... *H05K 1/0203* (2013.01); *H04N 23/52* (2023.01); *H05K 7/20145* (2013.01); *H05K 2201/064* (2013.01); *H05K 2201/10151* (2013.01)

(58) Field of Classification Search
CPC .. G03B 21/16; H05K 1/0203; H05K 7/20145; H05K 2201/064; H05K 2201/10151; H04N 23/52
See application file for complete search history.

(56) References Cited

U.S. PATENT DOCUMENTS

2008/0049194 A1* 2/2008 Yang ...................... G03B 21/16 353/61
2008/0151501 A1* 6/2008 Takasou ............ H05K 7/20154 361/697
2009/0168346 A1* 7/2009 Miyoshi ............ H05K 7/20145 361/695
2012/0257172 A1* 10/2012 Shirakura ............. G03B 21/16 353/61
2019/0385927 A1* 12/2019 Shibata ................. H10W 40/43
2023/0418135 A1* 12/2023 Oe ..................... H05K 7/20145
2024/0268081 A1* 8/2024 Lin .................... H05K 7/20154

FOREIGN PATENT DOCUMENTS

JP 2022077037 A 5/2022

* cited by examiner

*Primary Examiner* — Jacob R Crum
(74) *Attorney, Agent, or Firm* — Cowan, Liebowitz & Latman, P.C.

(57) ABSTRACT

An image capturing apparatus includes an image capturing apparatus body including a first side surface, a second side surface positioned on a side opposite from the first side surface, and a bottom surface substantially orthogonal to the first and second side surfaces, a circuit board, heat sources mounted on the circuit board, and a forced air-cooling unit including a duct arranged substantially parallel to the circuit board and thermally connected to the heat sources, and a fan. First, second, and third openings are formed in the first and second side surfaces, and the bottom surface. The force air-cooling unit includes first and second air inlet ports connected to the first and second openings, and an air outlet port connected to the third opening. The fan generates air flows from the first and second air inlet ports to the air outlet port, respectively.

10 Claims, 5 Drawing Sheets

ELECTRONIC APPARATUS CAPABLE OF EFFICIENTLY COOLING HEAT SOURCE

BACKGROUND OF THE INVENTION

Field of the Invention

The present invention relates to an electronic apparatus that is capable of efficiently cooling a heat source.

Description of the Related Art

In recent image capturing apparatuses, a signal processing load and power consumption have increased in accordance with improvement of image quality, causing an increase in the amount of heat generated by a heat source, such as an image capturing section and a data recording section. Therefore, a cooling structure within the apparatus is important.

Japanese Laid-Open Patent Publication (Kokai) No. 2022-77037 discloses a heat dissipation structure in an image capturing apparatus. In this apparatus, an air outlet port is disposed in a side part of a casing, and two air inlet ports are closely provided in a side part on a side opposite in a left-right direction from the side where the air outlet port is provided. Air drawn from the two intake ports merges in a midway and is guided toward the air outlet port by a fan.

However, in the apparatus disclosed in Japanese Laid-Open Patent Publication (Kokai) No. 2022-77037, two air flow passages from the two air inlet ports to the merging position are provided in parallel in a direction of the thickness of the apparatus, and hence the thickness of the apparatus body is increased in order to secure the two air flow passages.

Further, the directions of the air flow passages extending from the two air inlet ports to the air outlet port are substantially the same direction. The number of major heat sources is not necessarily one, and hence the cooling effect can be lowered depending on the arrangement of the heat sources. Further, the amount of heat generated by the heat sources is expected to further increase in the future, and hence the improvement of the cooling efficiency is more required.

Thus, there is room for improvement of the cooling structure from a viewpoint of efficient cooling of a heat source while preventing an increase in the size of the image capturing apparatus.

SUMMARY OF THE INVENTION

The present invention provides an electronic apparatus that is capable of efficiently cooling a heat source while preventing an increase in the size of an image capturing apparatus.

The present invention provides an electronic apparatus including an apparatus body that includes a first side surface, a second side surface positioned on a side opposite from the first side surface, and an orthogonal surface which is substantially orthogonal to the first side surface and the second side surface, a circuit board, at least one heat source mounted on the circuit board, and an air-cooling section that includes a duct which is arranged substantially parallel to the circuit board and is thermally connected to the at least one heat source, and a fan, wherein a first opening is formed in the first side surface, wherein a second opening is formed in the second side surface, wherein a third opening is formed in the orthogonal surface, wherein the air-cooling section includes a first air inlet port connected to the first opening, a second air inlet port connected to the second opening, and an air outlet port connected to the third opening, and wherein the fan generates air flows which flow from the first air inlet port and the second air inlet port to the air outlet port, respectively.

According to the present invention, it is possible to efficiently cool the heat source of the image capturing apparatus while preventing an increase in the size of the image capturing apparatus.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1A:
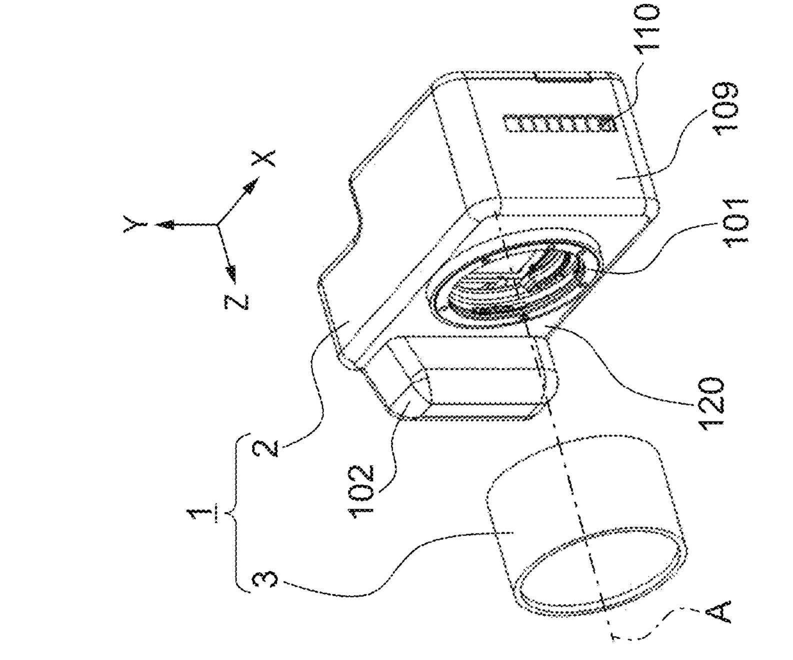
FIGS. 1A to 1C are perspective views of an image capturing apparatus.
Figure 1B:
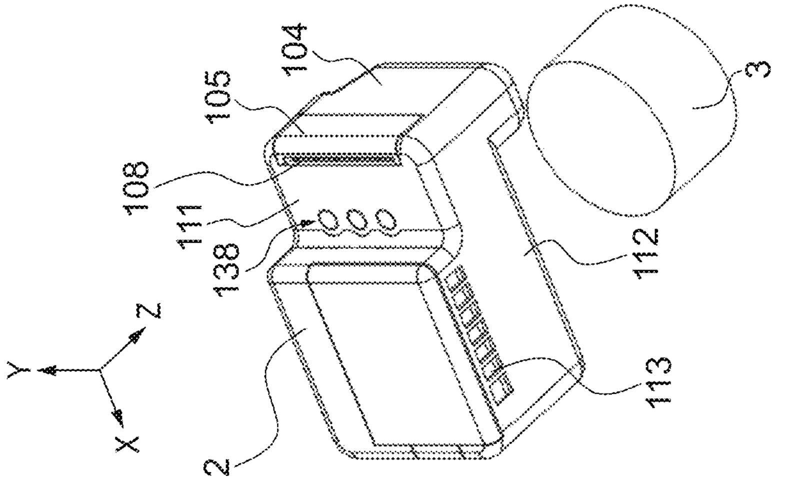
Figure 1C:
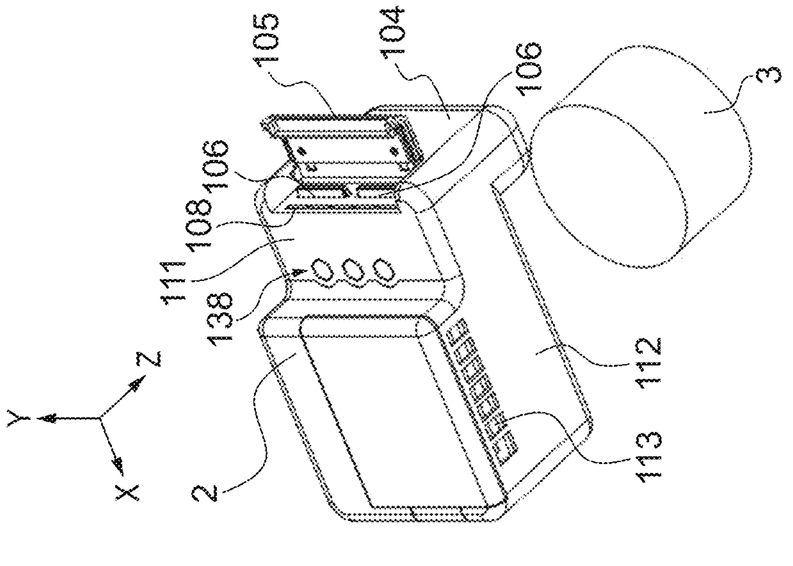

FIGS. 1A to 1C are perspective views of an image capturing apparatus according to an embodiment of the present invention. This image capturing apparatus, denoted by reference numeral 1, is formed by an image capturing apparatus body 2 (apparatus body) and a lens 3.

Hereafter, directions of each component are referred to with reference to the X, Y, Z coordinate axes shown e.g. in FIG. 1A. Here, an object side in a direction parallel to an optical axis A of the lens 3 is referred to as the front for convenience sake. For example, referring to FIG. 1A, a +Y direction is defined as upward, and a +Z direction is defined as front. A +X direction is defined as right, as viewed from the object side.

Therefore, FIG. 1A is the front perspective view of the image capturing apparatus 1. FIGS. 1B and 1C are the rear perspective views of the image capturing apparatus 1.

The image capturing apparatus body 2 includes a front surface 120, a rear surface 111, a first side surface 104 which is a left side surface, and a second side surface 109 which is a right side surface. The second side surface 109 is positioned on a side opposite in the left-right direction from the first side surface 104. Further, a bottom surface 112 of the image capturing apparatus body 2 is an orthogonal surface which is substantially orthogonal to the first side surface 104 and the second side surface 109.

The front surface 120 of the image capturing apparatus body 2 is provided with an annular mount 101. The lens 3 can be attached to and removed from the mount 101 of the image capturing apparatus body 2 by using a known bayonet system. On the left part of the image capturing apparatus body 2, a projecting part 102 projecting in the +Z direction is provided. The projecting part 102 functions as an accommodation part for accommodating a battery 103 (see FIG. 5) and a holding part used by a user to hold the image capturing apparatus body 2. On the rear surface 111, part of an operation section 138 for receiving a user operation is provided in an exposed state.

The first side surface 104 is formed with two insertion slots 106. A protection cover 105 which can be opened and closed is arranged on the first side surface 104. FIGS. 1B and 1C show the closed state and the opened state of the protection cover 105, respectively. As shown in FIG. 1B, the protection cover 105 covers the two insertion slots 106 in the closed state. As shown in FIG. 1C, when the protection cover 105 is opened, the two insertion slots 106 are exposed to the outside.

The first side surface 104 is formed with a first opening 108 for drawing air. The second side surface 109 is formed with a second opening 110 for drawing air. The bottom surface 112 is formed with a third opening 113 for discharging air.

Figure 2A:
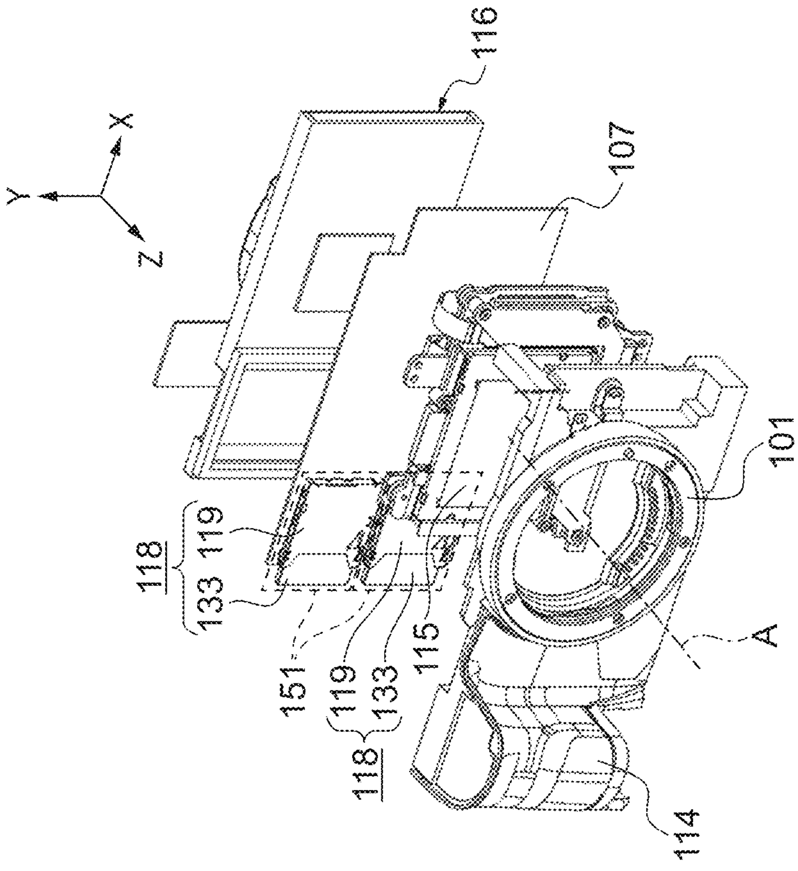
FIGS. 2A and 2B are a front exploded perspective view and a rear exploded perspective view of an image capturing apparatus body.
Figure 2B:
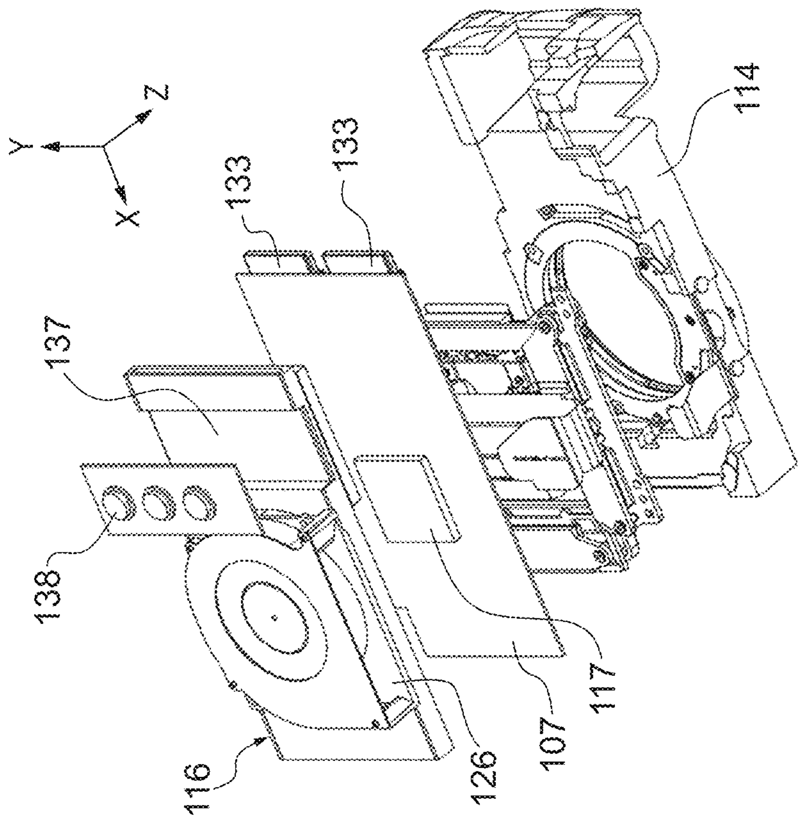

FIGS. 2A and 2B are a front exploded perspective view and a rear exploded perspective view of the image capturing apparatus body 2. Part of the components is omitted from illustration for convenience of explanation.

The image capturing apparatus body 2 mainly includes a base member 114, a circuit board 107, and a forced air-cooling unit 116. An image capturing section 115 is disposed on a side of the base member 114, toward the rear surface 111 (−Z side). The image capturing section 115 includes an image sensor 129 (see FIG. 5). The image sensor 129 is disposed substantially orthogonal to the optical axis A at a predetermined distance along the optical axis A from the mount 101. The circuit board 107 and the forced air-cooling unit 116 (air-cooling section) are further disposed on a side of the image capturing section 115, toward the rear surface 111, in the mentioned order.

On the circuit board 107, an image processor 117 and media accommodating portions 119 as part of a recording section 118 are mounted. The media accommodating portions 119 are each mounted in a mounting area 151. The image processor 117 is mounted on a surface of the circuit board 107, toward the rear surface 111 (−Z side), and the media accommodating portions 119 are mounted on a side of the circuit board 107, toward the front surface 120 (+Z side). As described hereinafter, the forced air-cooling unit 116 has a recessed portion 137 which is recessed on the +Z side, and the operation section 138 is disposed in a state accommodated in the recessed portion 137.

The recording section 118 includes the media accommodating portions 119. As a recording medium, a portable medium 133, such as an SD (registered trademark) memory card or a CFexpress (registered trademark) card, is inserted into and removed from each media accommodating portion 119. The recording section 118 records data into and reads out data from the portable medium 133 inserted in the media accommodating portion 119.

Figure 3B:
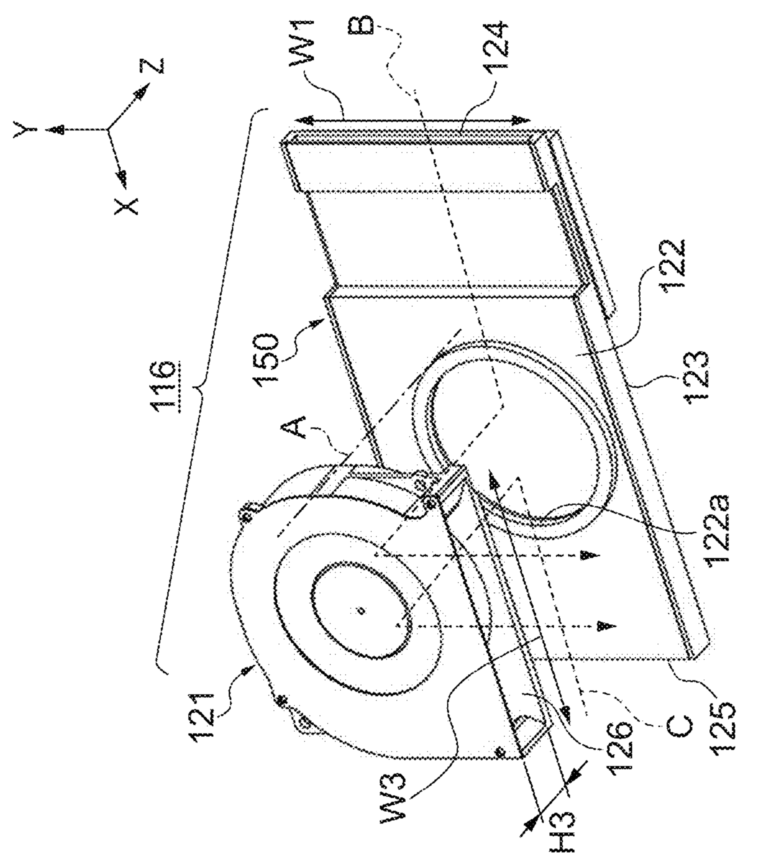
FIGS. 3A and 3B are a front perspective view and a rear perspective view of a forced air-cooling unit.
Figure 3A:
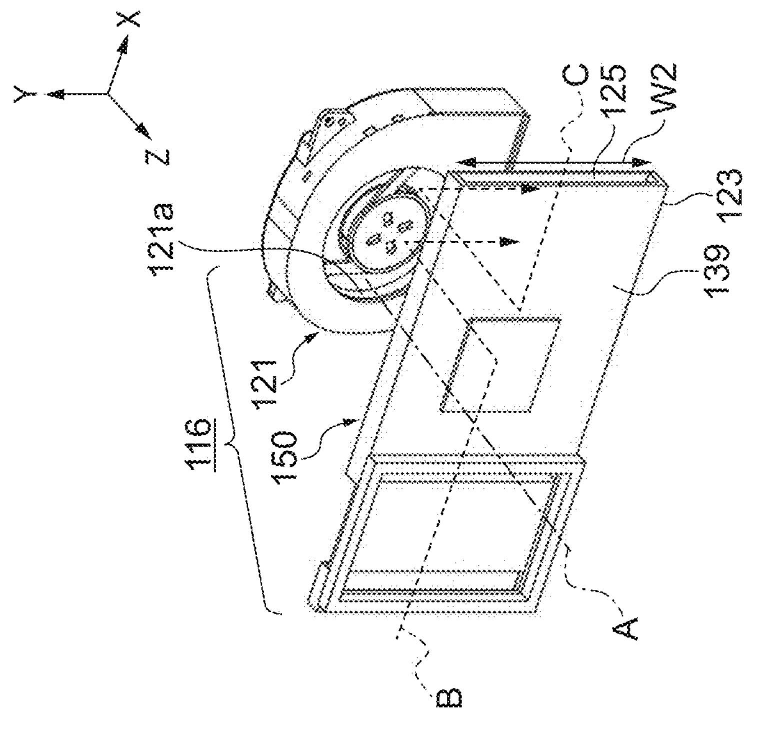

FIGS. 3A and 3B are a front perspective view and a rear perspective view of the forced air-cooling unit 116. The forced air-cooling unit 116 includes a duct 150 and a centrifugal fan 121. FIGS. 3A and 3B show the forced air-cooling unit 116 in a state in which the duct 150 and the centrifugal fan 121 are separated for convenience of explanation.

The duct 150 includes a duct base member 123 and a duct cover member 122. The centrifugal fan 121 and the duct cover member 122 cover the duct base member 123 from the −Z side to thereby form the hollow cylindrical forced air-cooling unit 116 having a first air inlet port 124 and a second air inlet port 125 in opposite ends in the X direction. The first air inlet port 124 is connected to the first opening 108 (see FIG. 1C). The second air inlet port 125 is connected to the second opening 110 (see FIG. 1A). An air outlet portion (air outlet port) 126 of the centrifugal fan 121 is connected to the third opening 113 (see FIG. 1B).

The duct 150 is arranged substantially parallel to the circuit board 107 and is thermally connected to heat sources (the recoding section 118 and the image processor 117), as described hereinafter. A shape of the forced air-cooling unit 116, which is projected along the optical axis A, is a substantially rectangular shape.

The centrifugal fan 121 has an air inlet portion 121*a* opening on the +Z side. A surface of the duct base member 123, which is opposed to the circuit board 107, is an opposed surface 139 (see FIG. 3A). An opening 122*a* is formed substantially in the central portion of a surface, opposite from the opposed surface 139, of the duct 150, at a location corresponding to the air inlet portion 121*a* (see FIG. 3B). The opening 122*a* is formed in the duct cover member 122 and is connected to the air inlet portion 121*a*.

Outside air supplied from the first air inlet port 124 through the first opening 108 (see FIG. 1C) is an air flow B in FIG. 3B. Outside air supplied from the second air inlet port 125 through the second opening 110 (see FIG. 1A) is an air flow C in FIG. 3B. These air flows B and C are drawn by the centrifugal fan 121 through the opening 122*a* and the air inlet portion 121*a* and discharged from the third opening 113 (see FIG. 1B) through the air outlet portion 126. That is, the centrifugal fan 121 generates air flows flowing from the first air inlet port 124 and the second air inlet port 125 to the air outlet portion 126, respectively.

Figure 4B:
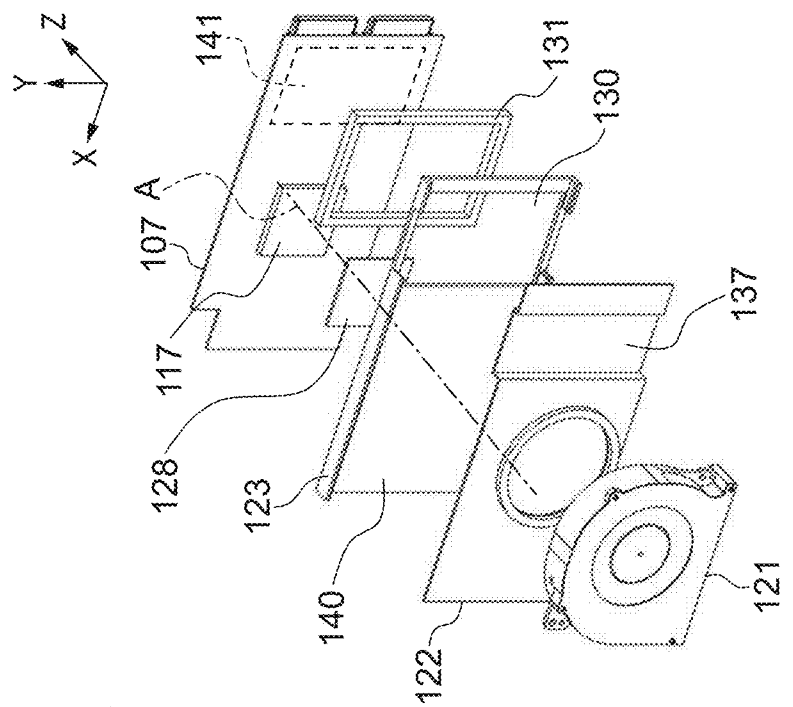
FIGS. 4A and 4B are a front exploded perspective view and a rear exploded perspective view of components including the forced air-cooling unit.
Figure 4A:
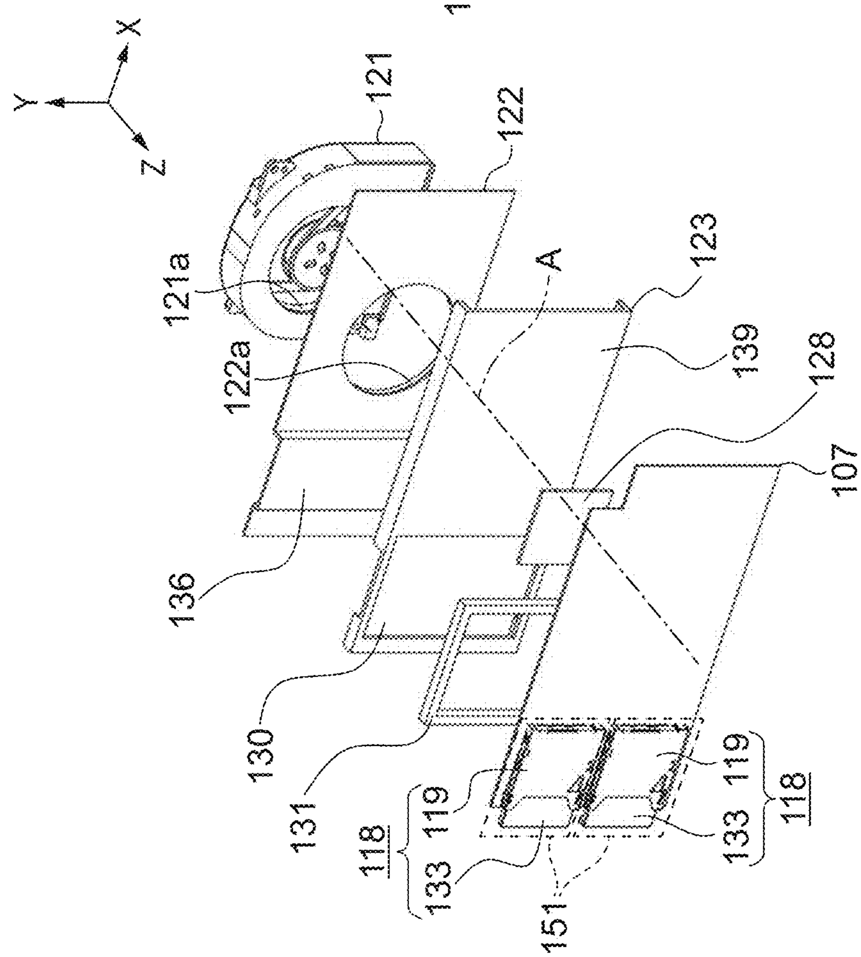
Figure 5:
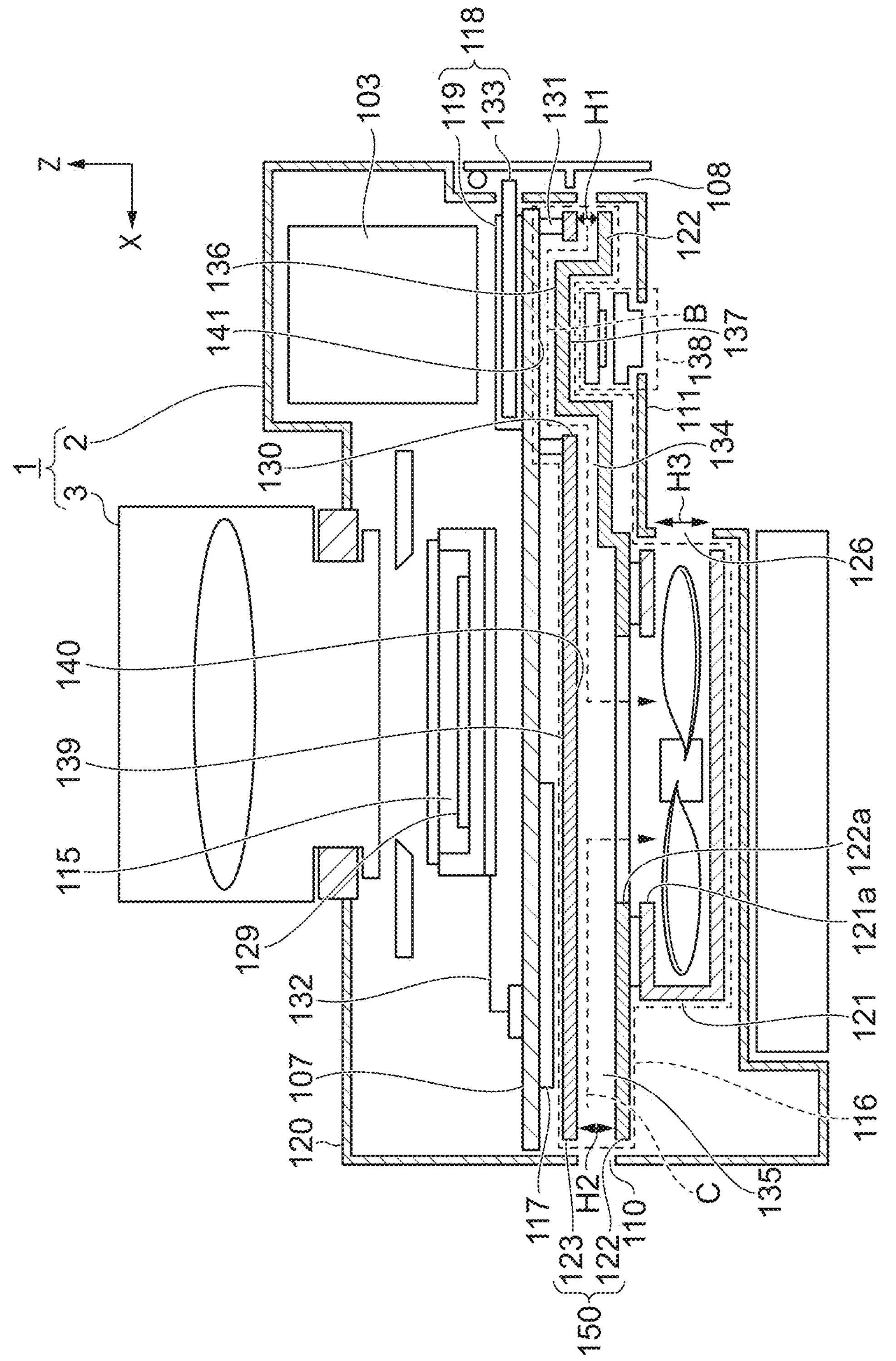
FIG. 5 is a schematic horizontal cross-sectional view of the image capturing apparatus.

FIGS. 4A and 4B are a front exploded perspective view and a rear exploded perspective view of the components including the forced air-cooling unit 116. FIG. 5 is a schematic horizontal cross-sectional view of the image capturing apparatus 1. A configuration for mainly cooling the image processor 117 and the recording section 118 will be described with reference to FIGS. 4A, 4B, and 5. Note that the air outlet portion 126 is illustrated in the rear surface 111 for convenience of explanation. Hereafter, the thickness direction of the circuit board 107, the Z direction, and the direction of the optical axis A are used as the same meaning.

The image sensor 129 appearing in FIG. 5 is an optical device that converts an optical image of light incident through an optical system to electrical signals. A ray of light incident through the lens 3 forms an image on the image sensor 129. The image sensor 129 converts optical information obtained from the formed image to electrical signals and transfers the electrical signals to the circuit board 107 via a flexible board 132. The image processor 117 mounted on the circuit board 107 performs necessary processing on the electrical signals sent from the image sensor 129 and then executes operations including sending the processed signals to the recording section 118 and recording the signals as image data.

The battery 103 supplies electric power used by the image capturing apparatus 1 to perform a variety of operations. By executing the variety of operations, electric power consumed by the image processor 117 is converted to heat in the image processor 117. Further, electric power consumed by the recording section 118 is converted to heat in the recording section 118. Therefore, the image processor 117 and the recording section 118 become major heat sources.

As shown in FIG. 5, a rear surface 140, which is a surface, toward the −Z side, of the duct base member 123 is opposed to the duct cover member 122. A first air flow passage 134 which extends from the first air inlet port 124 toward the centrifugal fan 121 and a second air flow passage 135 which extends from the second air inlet port 125 toward the centrifugal fan 121 are mainly formed by the rear surface 140 of the duct base member 123 and the surface of the duct cover member 122 on the +Z side.

Part of the opposed surface 139 (see FIGS. 4A and 5) of the duct base member 123 forms a heat exchange part for exchanging heat with the image processor 117. The opposed surface 139 is brought into close contact with the image processor 117 via an elastic heat conduction member 128 (see FIGS. 4A and 4B) and transfers the heat of the image processor 117 to the duct base member 123. Therefore, the image processor 117 is thermally connected to the second air flow passage 135.

An area of the surface area of the circuit board 107 on the −Z side, which overlaps at least part of the mounting areas 151 of the media accommodating portions 119, as viewed from the Z direction (direction of the optical axis A), is defined as an accommodating portion-corresponding area 141 (see FIG. 4B). The duct base member 123 is formed with a rectangular opening 130 (board-side opening). The rectangular opening 130 is formed in an area including the accommodating portion-corresponding area 141 as viewed from the Z direction.

A rectangular elastic sealing member 131 (sealing member) is arranged between the duct base member 123 and the circuit board 107 in the Z direction in a state surrounding the periphery of the rectangular opening 130. Therefore, the accommodating portion-corresponding area 141 is exposed inside the forced air-cooling unit 116 and performs heat exchange directly with the air flow. That is, the accommodating portion-corresponding area 141 forms part of the first air flow passage 134 via the rectangular opening 130 (see FIG. 5). Thus, the recording section 118 is thermally connected to the first air flow passage 134.

Since the elastic sealing member 131 is interposed between the circuit board 107 and the duct base member 123 in a close contact state around the rectangular opening 130, part between the first air flow passage 134 and the outside of the duct 150 is sealed, whereby the cooling performance is ensured.

The duct base member 123 (first wall portion) and the duct cover member 122 (second wall portion) can be defined as two wall portions forming the duct 150. The duct base member 123 is a wall portion opposed to the circuit board 107, and the duct cover member 122 is a wall portion which is not opposed to the circuit board 107.

The duct cover member 122 is formed with a projecting portion 136 projecting toward the circuit board 107 (+Z side) in the Z direction (see FIGS. 4A and 5). At least part of the projecting portion 136 enters the rectangular opening 130. Further, since the projecting portion 136 is formed on the duct cover member 122, the duct cover member 122 is formed with the recessed portion 137 in a surface opposite from the circuit board 107 in the Z direction (surface on the −Z side). That is, the recessed portion 137 is generated outside the duct 150 in accordance with formation of the projecting portion 136. Then, at least part of the operation section 138 is disposed in the recessed portion 137. This makes it possible to prevent an increase in the size of the apparatus in the thickness direction of the circuit board 107.

A cross-sectional area (flow passage area) of each air-flow passage in the forced air-cooling unit 116 will be described.

As shown in FIG. 5, widths, in the Z direction (widths in a transverse direction), of a cross-section of the first air-flow passage 134, a cross-section of the second air-flow passage 135, and the air outlet portion 126 are represented by widths H1, H2, and H3, respectively. A width, in the Z direction, of the first air inlet port 124 is the same as the cross-section of the first air-flow passage 134 and is the width H1. A width, in the Z direction, of the second air inlet port 125 is the same as the cross-section of the second air-flow passage 135 and is the width H2. Further, as shown in FIGS. 3A and 3B, widths of the first air inlet port 124, the second air inlet port 125, and the air outlet portion 126 in a longitudinal direction substantially orthogonal to the transverse direction are defined as widths W1, W2, and W3, respectively. Widths of a cross-section of the first air-flow passage 134 and a cross-section of the second air-flow passage 135 in the longitudinal direction are the same as the widths of the first air inlet port 124 and the second air inlet port 125 and are represented by the widths W1 and W2, respectively.

The width W1, the width W2, and the width W3 are substantially equal to each other (W1=W2=W3). Further, the sum of the width H1 and the width H2 is substantially equal to the width H3 (H1+H2=H3). Therefore, the sum of the opening area of the first air inlet port 124 and the opening area of the second air inlet port 125 is substantially equal to the opening area of the air outlet portion 126.

The air flow B and the air flow C, generated by the centrifugal fan 121, flow through the first air flow passage 134 and the second air flow passage 135, respectively. Since the sum of the opening area of the first air inlet port 124 and the opening area of the second air inlet port 125 is substantially equal to the opening area of the air outlet portion 126, an intake air amount and a discharged air amount in the forced air-cooling unit 116 are balanced.

Further, the image processor 117 generates a larger amount of heat than the recording section 118, and hence an air flow amount required to dissipate heat is larger for the image processor 117 than for the recording section 118. Here, the width H2 is equal to or larger than the width H1 (H2≥H1), and H2>H1 is preferable. Since W1=W2 holds, the opening area of the second air inlet port 125 is larger than the opening area of the first air inlet port 124. Therefore, the cross-sectional area of the second air flow passage 135 is larger than the cross-sectional area of the first air flow passage 134.

Since the recording section 118 is thermally connected to the first air flow passage 134, and the image processor 117 is thermally connected to the second air flow passage 135, it is possible to effectively cool a plurality of heat sources with air flowing in from different air inlet ports. What is more, since the cross-sectional area of the second air flow passage 135 is larger than the cross-sectional area of the first air flow passage 134, it is possible to increase an effect of cooling the image processor 117 which generates a larger amount of heat and thereby efficiently cool the two heat sources. Further, since the plurality of air inlet ports are provided, the width H1 and the width H2 are prevented from becoming too long. Further, since the image processor 117 which is a heat source having high power consumption is disposed on a side close to the projecting portion 102 which forms the holding portion in the left-right direction, the arrangement also contributes to the increase of the effect of cooling the image processor 117.

According to the present invention, in the image capturing apparatus body 2, the first opening 108 is formed in the first side surface 104, the second opening 110 is formed in the second side surface 109, and the third opening 113 is formed in the bottom surface 112. The forced air-cooling unit 116 includes the first air inlet port 124 connected to the first opening 108, the second air inlet port 125 connected to the second opening 110, and the air outlet portion 126 connected to the third opening 113. The forced air-cooling unit 116 includes the duct 150 which is arranged substantially parallel to the circuit board 107 and is thermally connected to the heat sources mounted on the circuit board 107, and the centrifugal fan 121. The centrifugal fan 121 generates the air flows B and C which flow from the first air inlet port 124 and the second air inlet port 125 to the air outlet portion 126, respectively.

With this, respective air flows from the two air inlet ports (124 and 125) separated in the left-right direction through different passages (the first air-flow passage 134 and the second air-flow passage 135) meet at the centrifugal fan 121, and hence it is possible to effectively cool the heat sources associated with the respect air flows. For example, the recording section 118 is mainly cooled by the first air-flow passage 134, and the image processor 117 is mainly cooled by the second air-flow passage 135.

Further, it is easy to form the first air-flow passage 134 and the second air-flow passage 135 which are the different passages such that they do not overlap each other as viewed from the Z direction, and hence an increase in the size of the apparatus in the thickness direction is prevented.

Therefore, it is possible to efficiently cool the heat sources while preventing an increase in the size of the image capturing apparatus 1.

Further, since the amount of heat generated by the image processor 117 is larger than the amount of heat generated by the recording section 118, and the cross-sectional area of the second air flow passage 135 is larger than the cross-sectional area of the first air flow passage 134, it is possible to effectively cool the two heat sources.

The accommodating portion-corresponding area 141 as part of the area of the circuit board 107 is an area overlapping at least part of the mounting areas 151 of the media accommodating portions 119 as viewed from the Z direction. The accommodating portion-corresponding area 141 forms part of the first air-flow passage 134 via the rectangular opening 130 of the duct base member 123. This makes it possible to increase the effect of cooling the recording section 118.

Further, since the elastic sealing member 131 is interposed between the circuit board 107 and the duct base member 123 in a close contact state around the rectangular opening 130, part between the first air-flow passage 134 and the outside of the duct 150 is sealed, and the cooling performance is ensured.

Further, at least part of the projecting portion 136 formed on the duct cover member 122 enters the rectangular opening 130, and at least part of the operation section 138 is disposed in the recessed portion 137 generated in accordance with formation of the projecting portion 136. This makes it possible to prevent an increase in the size of the apparatus in the thickness direction of the circuit board 107.

Note that although in the present embodiment, the recording section 118 is formed by the portable medium 133 and the media accommodating portion 119, the present invention can also be applied to a configuration in which a nonvolatile memory which is a recording medium is mounted on the circuit board 107. That is, the recording medium to be used is not limited to a portable type. Further, the recording section 118 as the heat source mainly refers to the media accommodating portions 119, and it does not matter whether the portable medium 133 is inserted or not. Therefore, a recording medium is not necessarily included in the recording section to which the present invention is applied.

Note that although the image capturing apparatus 1 is a lens-interchangeable type, in a case where the present invention is applied to an image capturing apparatus, this apparatus can be a lens-integrated type.

Note that the present invention can be applied not only to the image capturing apparatus but also to a variety of electronic apparatuses each having an apparatus body including two side surfaces and an orthogonal surfaces which is substantially orthogonal to these side surfaces.

Note that in the present embodiment, an expression with "substantially" is not intended to exclude "complete". For example, the words "substantially parallel", "substantially orthogonal", "substantially equal", "substantially rectangular shape", and "substantially in the central portion" include "completely parallel", "completely orthogonal", "completely equal", "completely rectangular shape", and "completely in the central portion", respectively.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-119923 filed Jul. 24, 2023, which is hereby incorporated by reference herein in its entirety.

What is claimed is:

1. An electronic apparatus comprising:

an apparatus body that includes a first side surface, a second side surface positioned on a side opposite from the first side surface, and an orthogonal surface which is substantially orthogonal to the first side surface and the second side surface;

a circuit board;

at least one heat source mounted on the circuit board; and an air-cooling section that includes a duct which is arranged substantially parallel to the circuit board and is thermally connected to the at least one heat source, and a fan;

wherein a first opening is formed in the first side surface, wherein a second opening is formed in the second side surface, wherein a third opening is formed in the orthogonal surface, wherein the air-cooling section includes a first air inlet port connected to the first opening, a second air inlet port connected to the second opening, and an air outlet port connected to the third opening, wherein the fan generates air flows which flow from the first air inlet port and the second air inlet port to the air outlet port, respectively, wherein a first wall portion of two wall portions forming the duct, which is opposed to the circuit board, is formed with a board-side opening, wherein an area of part of the circuit board forms part of an air flow passage extending from the first air inlet port to the fan via the board-side opening, and wherein the area of part of the circuit board is an area overlapping at least part of an area where the at least one heat source is mounted, as viewed from a thickness direction of the circuit board.

2. The electronic apparatus according to claim 1, wherein the air outlet port is formed in the fan, and wherein air flowing in from the first air inlet port and the second air inlet port, respectively, is drawn by the fan and is discharged from the air outlet port.

3. The electronic apparatus according to claim 2, wherein the at least one heat source includes a first heat source and a second heat source, which are mounted on the circuit board, wherein the first heat source is thermally connected to a first air flow passage extending from the first air inlet port to the fan, and wherein the second heat source is thermally connected to a second air flow passage extending from the second air inlet port to the fan.

4. The electronic apparatus according to claim 3, wherein an amount of heat generated by the second heat source is larger than an amount of heat generated by the first heat source, and wherein a cross-sectional area of the second air flow passage is equal to or larger than a cross-sectional area of the first air flow passage.

5. The electronic apparatus according to claim 1, wherein a sum of an opening area of the first air inlet port and an opening area of the second air inlet port is substantially equal to an opening area of the air outlet port.

6. The electronic apparatus according to claim 1, further comprising a sealing member that is interposed between the circuit board and the first wall portion in a close contact state around the board-side opening.

7. The electronic apparatus according to claim 1, wherein a second wall portion of the two wall portions, which is not opposed to the circuit board, is formed with a projecting portion projecting toward the circuit board in the thickness direction of the circuit board, and wherein part of the projecting portion enters the board-side opening.

8. The electronic apparatus according to claim 7, wherein the second wall portion is formed with a recessed portion in a surface opposite from the circuit board in the thickness direction of the circuit board in accordance with formation of the projecting portion on the second wall portion, and wherein at least part of an operation section which receives a user operation is disposed in the recessed portion.

9. The electronic apparatus according to claim 1, wherein a recording section that records data in a recording medium is included in the at least one heat source.

10. The electronic apparatus according to claim 1, wherein the electronic apparatus is an image capturing apparatus that has an image sensor for converting an optical image of light incident through an optical system to electrical signals.

* * * * *